(12) United States Patent
Lin et al.

(10) Patent No.: US 9,384,978 B1
(45) Date of Patent: Jul. 5, 2016

(54) METHOD OF FORMING TRENCHES

(71) Applicant: UNITED MICROELECTRONICS CORP., Hsin-Chu (TW)

(72) Inventors: Chao-Hung Lin, Changhua County (TW); Shih-Fang Hong, Tainan (TW); Li-Wei Feng, Kaohsiung (TW); Shih-Hung Tsai, Tainan (TW); Ssu-I Fu, Kaohsiung (TW); Jyh-Shyang Jenq, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/636,200

(22) Filed: Mar. 3, 2015

(30) Foreign Application Priority Data

Jan. 14, 2015 (TW) .............................. 104101229 A

(51) Int. Cl.
*H01L 21/76* (2006.01)
*H01L 21/033* (2006.01)
*H01L 21/311* (2006.01)

(52) U.S. Cl.
CPC ...... *H01L 21/0337* (2013.01); *H01L 21/31116* (2013.01)

(58) Field of Classification Search
CPC ............... H01L 21/76224; H01L 21/76232; H01L 21/76229; H01L 21/76235; H01L 21/823481
USPC ....................................................... 438/424
See application file for complete search history.

(56) References Cited

U.S. PATENT DOCUMENTS

| 4,799,990 A | 1/1989 | Kerbaugh |
| 5,429,988 A | 7/1995 | Huang |
| 2007/0023864 A1* | 2/2007 | Khater ............... H01L 29/7378 257/565 |
| 2015/0364578 A1* | 12/2015 | Liu .................. H01L 29/66795 257/401 |

* cited by examiner

*Primary Examiner* — Quoc Hoang
(74) *Attorney, Agent, or Firm* — Winston Hsu; Scott Margo

(57) ABSTRACT

The present invention provides a method for forming trenches. First, a mandrel layer is formed on a substrate, wherein the mandrel layer comprises a stop layer and a sacrificial layer. A spacer is formed on at least a sidewall of the mandrel layer, following by forming a material layer on the substrate for covering the spacer and the mandrel layer. After performing a removing process to remove apart of the material layer, apart of the spacer and the sacrificial layer; the spacer is removed to form at least one first trench in the remaining material layer and the mandrel.

19 Claims, 5 Drawing Sheets

US 9,384,978 B1

METHOD OF FORMING TRENCHES

BACKGROUND OF THE INVENTION

1. Field of the Invention

The present invention is related to a method of forming trenches, and more particularly, to a method of forming trenches by using reverse sidewall image transfer (reverse STI) technology.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer, for example down to feature sizes of 65 nanometers (nm), 45 nm and even to 32 nm, making the spacer between semiconductor devices smaller. However, due to the optical proximity effect, the spacer is about to meet the physical restriction in a lithography process. Hence, the researchers are devoted to develop methods to form semiconductor devices with finer size.

SUMMARY OF THE INVENTION

The present invention therefore provides a method of forming trenches with smaller size and a width of the formed trench can be controlled precisely.

According to one embodiment, the present invention provides a method of forming trenches. First, a mandrel layer is formed on a substrate, wherein the mandrel layer comprises a stop layer and a sacrificial layer. A spacer is formed on at least a sidewall of the mandrel layer, following by forming a material layer on the substrate for covering the spacer and the mandrel layer. After performing a removing process to remove apart of the material layer, a part of the spacer and the sacrificial layer; the spacer is removed to form at least one first trench in the remaining material layer and the mandrel.

The present invention provides a method of forming trenches. By using the multi-layered mandrel layer, the width of the trench can be accurately formed. A CMP process is preferably used to increase the reliability of the manufacturing process and to improve product yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
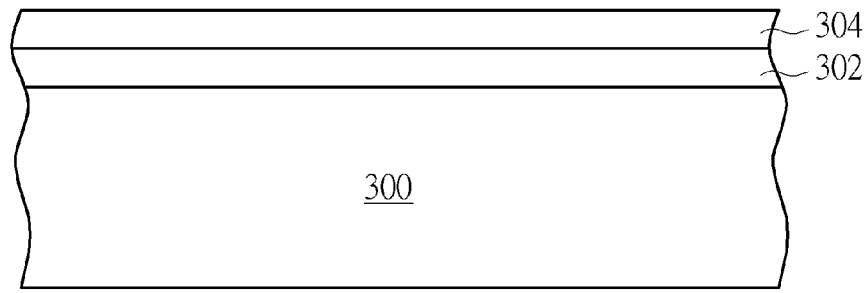
FIG. 1 to FIG. 10 show schematic diagrams of method of forming trenches according to one embodiment of the present invention.

Please refer to FIG. 1 to FIG. 10, which show schematic diagrams of method of forming trenches according to one embodiment of the present invention. As shown in FIG. 1, a substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. In another embodiment, the substrate 300 can include one or a plurality of dielectric layers in which one or a plurality of microelectronic components are disposed therein, such as a complementary metal oxide semiconductor (CMOS) or a photo-diode, or even a metal interconnection system. In another embodiment, the substrate 300 can include a mask layer (not shown) or a material layer (not shown) so other semiconductor manufacturing process can be performed followed by the method of forming trenches of the present invention to form devices in the substrate 300, for example, a dual sidewall image transfer (dual SIT) process. After providing the substrate 300, a liner layer 302 and a mask layer 304 can be formed sequentially on the substrate 300. The mask layer 304 can be any material that is suitable for severing as a mask in an etching process, such as SiN, SiON, SiC or advanced pattern film (APF) provided by Applied Material Corporation. The liner layer 302 is used to provide additional adhesion or buffer between the substrate 300 and the mask layer 304. In one embodiment, the liner layer 302 can be $SiO_2$, but is not limited thereto. In another embodiment, the liner layer 302 can be omitted.

Figure 2:
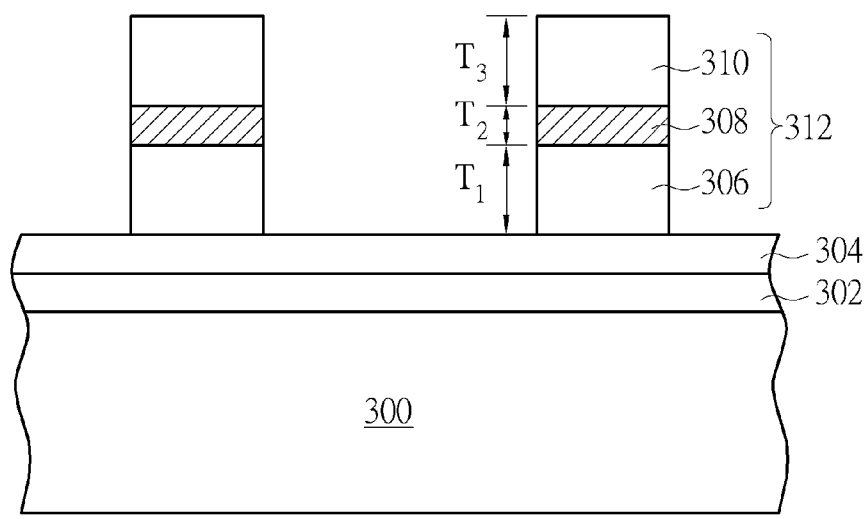

As shown in FIG. 2, at least one mandrel layer 312 is formed on the mask layer 304. In one embodiment, the mandrel layer 312 comprises a sacrificial layer 310, a stop layer 308 and a support layer 306. In one embodiment, the sacrificial layer 306 includes poly-silicon or amorphous silicon; the stop layer 308 includes silicon nitride (SiN), silicon oxynitride (SiON), titanium nitride (TiN), tantalum nitride (TaN), or combinations thereof; the support layer 306 includes a material the same or different from that of the sacrificial layer 310. In one embodiment, the support layer 306 may be omitted. The method of forming the mandrel layer 312, for example, includes forming a support material layer (not shown), a stop material layer (not shown) and a sacrificial material layer (not shown) sequentially on the substrate 300, and performing a photo-etching-process (PEP) to pattern said mandrel layer 312, which therefore comprises at least one vertically aligned sidewall. In one embodiment, the support layer 306 has a first thickness $T_1$, the stop layer 308 has a second thickness $T_2$, and the sacrificial layer 310 has a third thickness $T_3$.

Figure 3:
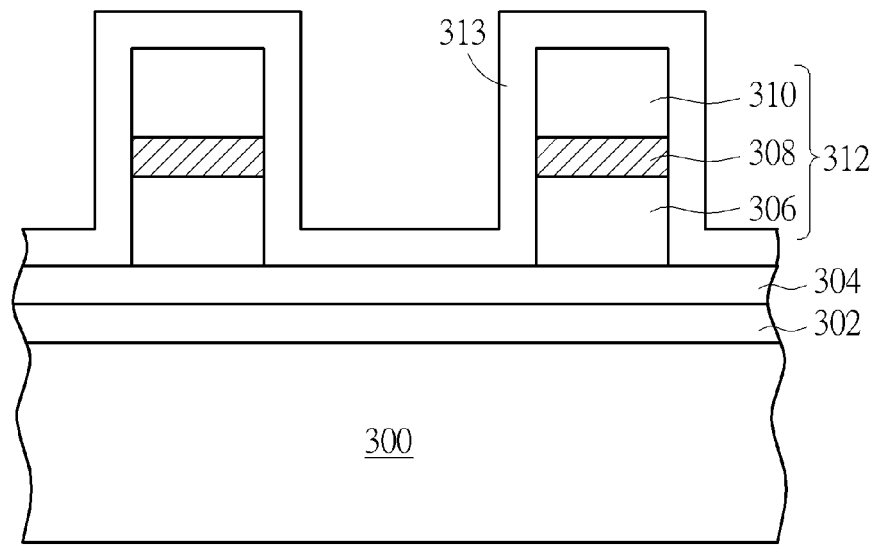

Next, as shown in FIG. 3, a spacer material layer 313 is formed conformally on the mandrel layer 312, to preferably cover a sidewall and a top surface of the mandrel layer 312. In one embodiment, the spacer material layer 313 includes, for example, silicon oxide, silicon nitride, high temperature oxide (HTO) or silicon nitride formed with hexachlorodisilane ($Si_2Cl_6$) ("HCD-SiN"), but is not limited thereto.

Figure 4:
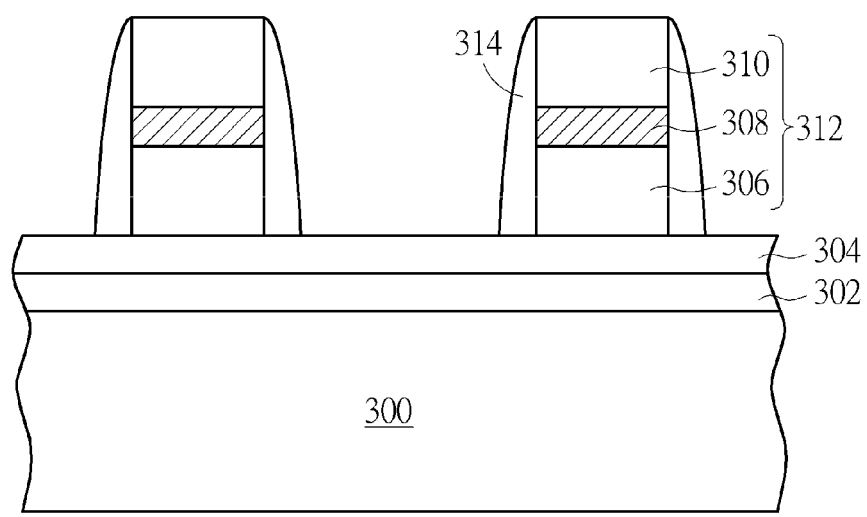

Follow-up, as shown in FIG. 4, an anisotropical etch step is performed to form the spacer layer 314. In one embodiment, the spacer layer 314 is formed only on the sidewalls of the mandrel layer 312. The spacer 314 has a curved cross-section with a width increasing from top to bottom. In another embodiment, spacer 314 with a predetermined thickness remains on the top surface of the mandrel 312. In another embodiment, the anisotropic etching step can be omitted so the spacer 314 on the sidewall of the mandrel 312 has a uniform thickness.

Figure 5:
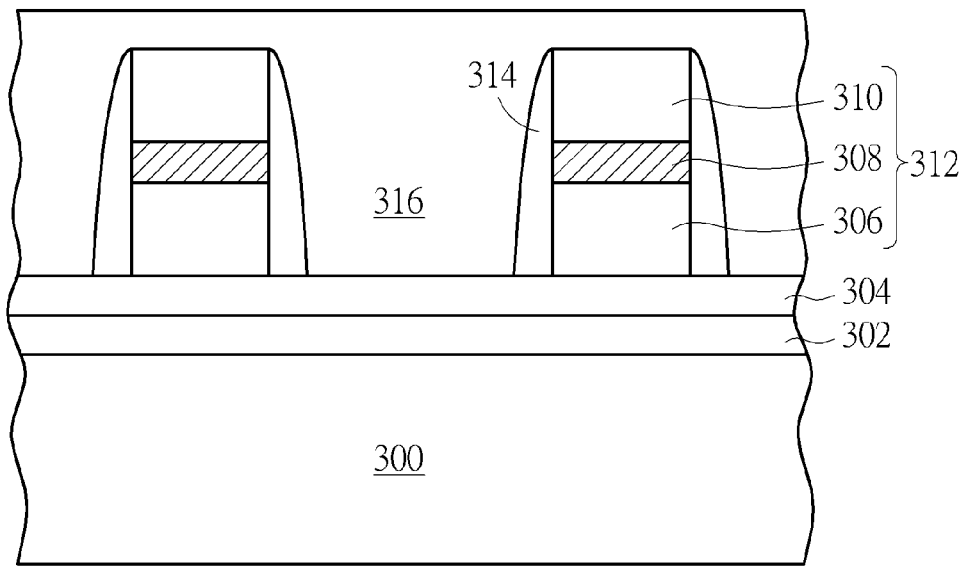

As shown in FIG. 5, a material layer 316 is formed comprehensively on the substrate 300. Preferably, the material layer 316 is filled into the space between each mandrel layer 312, therefore covering the spacer 314 and the mandrel layer 312. The material layer 316 is made of different material from that of the stop layer 308 in the mandrel layer 312, so the removing speeds of the material layer 316 and the stop layer 308 are significantly different in one removing process. In one embodiment, the material layer 316, for example, includes silicon oxide, silicon nitride or organic material such as photoresist, and is not limited thereto.

Figure 6:
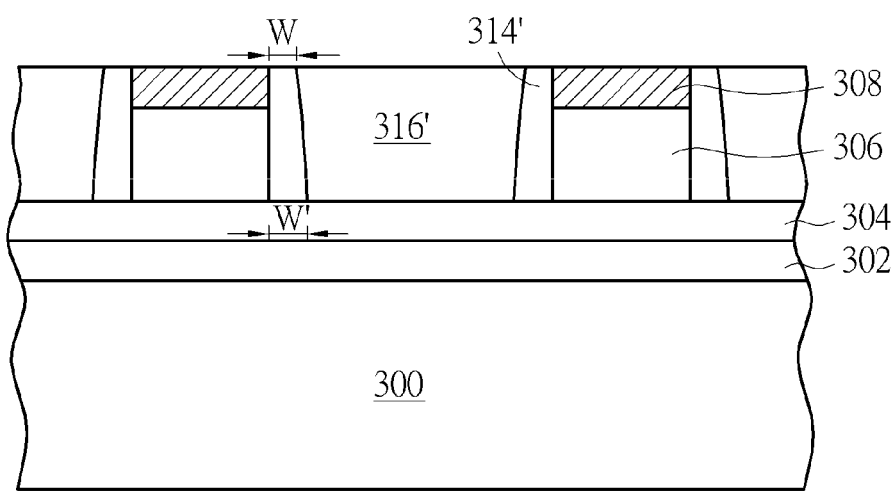
Figure 7:
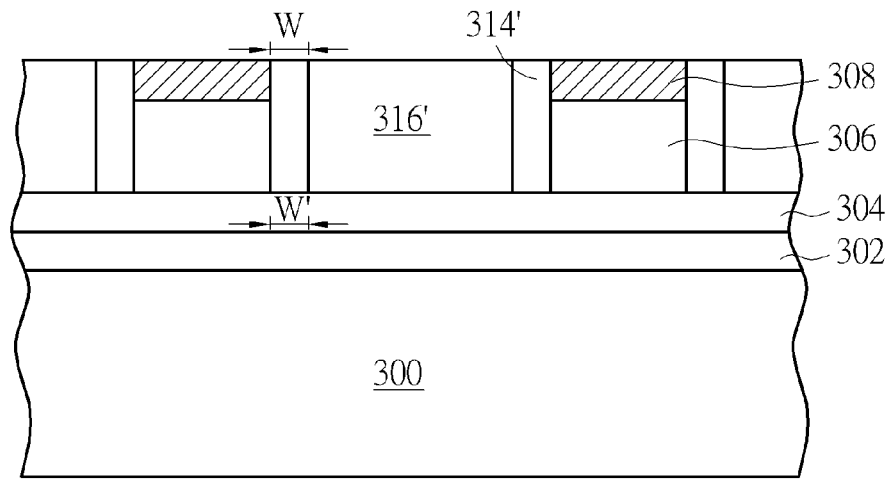

As shown in FIG. 6, a removing process is carried out for removing a part of the material layer 316, a part of the spacer 314 and complete removing the sacrificial layer 310. In one embodiment, the removing process stops on the stop layer 308 in the mandrel layer 312 and preferably does not remove or removes a very small portion of the stop layer 308. Precisely speaking, the removing speed of the stop layer 308 in the removing process is much smaller than those of the material layer 316, the spacer 314 and the sacrificial layer 310. In one embodiment, the removing process includes a chemical mechanical polishing (CMP) step, and the stop layer 308 has a polishing selectivity with respected to the material layer 316, the spacer 314 and the sacrificial layer 310. After the CMP step, a top surface of the remaining material layer 316' is leveled with a top surface of the spacer 314' and a top surface of the stop layer 308. The spacer 314' has a width W in the top surface and a width W' in the bottom surface, wherein the width W is smaller than the width W. It is noted that when in the embodiment that the anisotropical etching process is omitted, the width W is substantially equal to the width W', as shown in FIG. 7.

Figure 8:
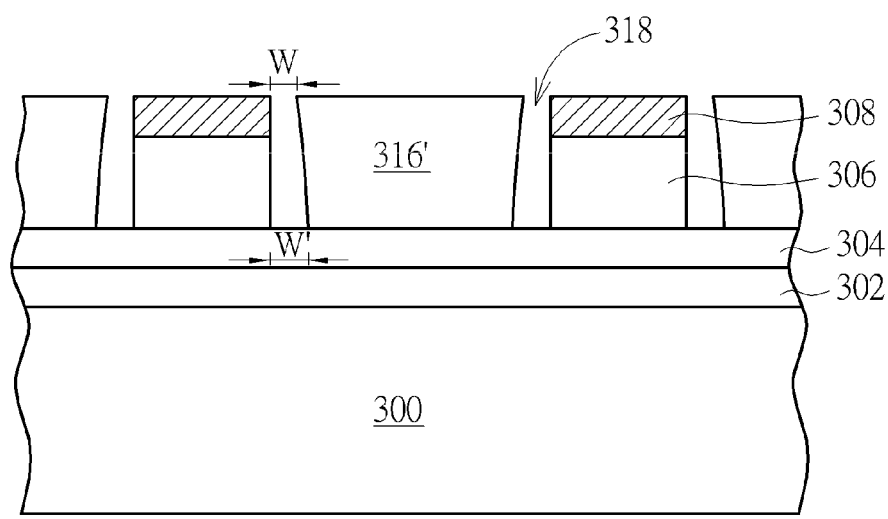

As shown in FIG. 8, the spacer 314' is completely removed, and a first trench 318 is formed between the mandrel layer 312 (including the stop layer 308, or the stop layer 308 and the support layer 306) and the material layer 316'. Preferably, the mask layer 304 is exposed by the first trench 318. Considering the accuracy of this removing process, the material of the spacer 314' preferably has a removing selectivity with respect to the stop layer 308, the material layer 318', as well as the mask layer 304. The formed first trench 318 has a shape corresponding to the contour of the spacer 314'. For instance, the first trench 318 can have a width W at the opening and a width W' in the bottom surface. In the present embodiment, the width W is smaller than the width W'. In another embodiment of FIG. 7, they may be equal.

Figure 9:
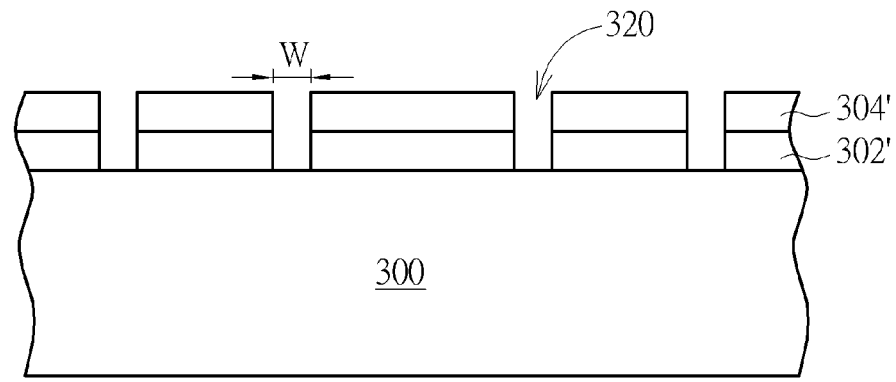

As shown in FIG. 9, by using the material layer 316' and the stop layer 308 as a mask, the mask layer 304 and the liner layer 302 are patterned, forming a second trench 320 in the mask layer 304 and the liner layer 302. The second trench 320 corresponds to the first trench 318. In one embodiment, the second trench 320 has a width W. Then, the material layer 316' and the mandrel layer 312 are completely removed.

Figure 10:
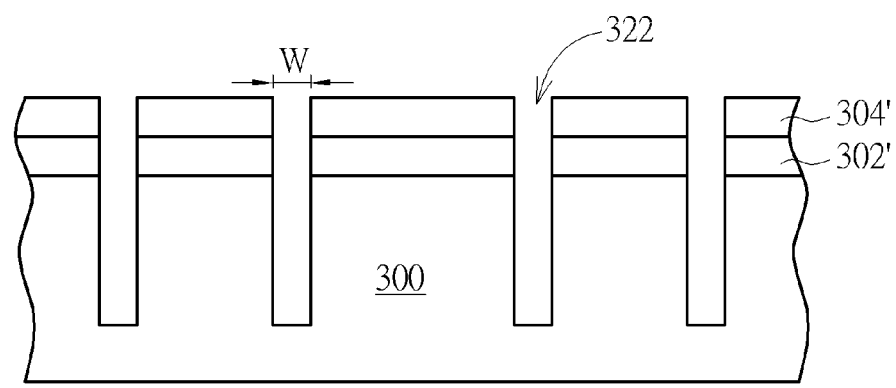

As shown in FIG. 10, by using the patterned mask layer 304' as a mask, the substrate 300 is patterned, thereby forming at least one third trench 322 in the substrate 300. The third trench 322 has a width W. The third trench 322 can be used as a part of various semiconductor elements, e.g., a shallow trench isolation (STI) by filling an insulating material therein, or a metal interconnection system by filling a metal therein. To one skilled in the art, the formed third trench 322 can be subjected to other semiconductor process depending on the design of the product or the process. For example, a spacer can be formed on the sidewall of the third trench 322 and an etching process can be performed by to pattern the substrate, so a trench with finer width can be obtained. Alternatively, a material layer can be filled into the third trench 322 and the substrate 300 other than the material layer is removed, such that the material layer can be used as a part of a semiconductor device.

It is one salient feature of the present invention to use a multi-layered structure of the mandrel layer 312, for example, including a support layer 306, a stop layer 308, and a sacrificial layer 310. The stop layer 308 and the sacrificial layer 310 have different materials. In the removing process as shown in FIG. 6, the removing process preferably comprises chemical mechanical polishing process. Comparing to conventional etching back process, a more flat surface can be obtained and the width W of the spacer 314' can be obtained predictably. Therefore, the first trench 318, the second trench 320 and the third trench 322 can also include the width W. Further, by controlling the thickness of each layer in the mandrel layer 312 (the first thickness $T_1$ of the support layer 306, the second thickness $T_2$ of the stop layer 308, the third thickness $T_3$ of the sacrificial layer 310), and/or the shape of spacer 314 shrinking from bottom to top, the width W of the spacer 314' in FIG. 6 can be well controlled. The larger the ratio of the first thickness T1 plus the second thickness T2 and the total mandrel layer 312, the smaller the width W is; conversely, the smaller the ratio of the first thickness T1 plus the second thickness T2 and the total mandrel layer 312, the larger the width W is. In other words, a ratio of the height of the top surface of the stop layer 308 ($T_1+T_2$) and the total height of the mandrel layer 312 ($T_1+T_2+T_3$) is substantially equal to a ratio of the width W of the top surface of the spacer 314' and the width W' of the bottom surface of the spacer 314'. In one embodiment, the first thickness is the same as the second thickness plus the third thickness ($T_1=T_2+T_3$). In another embodiment when omitting the support layer 306, the second thickness is equal to the third thickness ($T_2=T_3$).

Further, in another embodiment, the mask layer 304 and the liner layer 302 can be omitted. As such, in the step of FIG. 6, the removing process in FIG. 6 can directly use the material layer 316' and the stop layer 308 as a mask to pattern the substrate 300, thereby forming the third trench 322.

In summary, the present invention provides a method of forming trenches. By using the multi-layered mandrel layer, the width of the trench can be accurately formed. A CMP process is preferably used to increase the reliability of the manufacturing process and to improve product yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming trenches, comprising:
   forming a mandrel layer on a substrate, wherein the mandrel layer comprises a stop layer and a sacrificial layer;
   forming a spacer on at least a sidewall of the mandrel layer;
   forming a material layer on the spacer and the mandrel layer;
   performing a removing process to remove a part of the material layer, a part of the spacer and the sacrificial layer, wherein after the removing process, a top surface of the stop layer is leveled with a top surface of the spacer and a top surface of the material layer; and removing the spacer to form at least one first trench in the remaining material layer and the mandrel layer.

2. The method of forming trenches according to claim 1, wherein the removing process is a chemical mechanical polish (CMP) process.

3. The method of forming trenches according to claim 1, wherein the removing process stops on the stop layer.

4. The method of forming trenches according to claim 1, wherein the stop layer has a chemical polishing selectivity with respect to the material layer and the spacer.

5. The method of forming trenches according to claim 1, wherein the stop layer comprises SiN, SiON, TiN or TaN.

6. The method of forming trenches according to claim 1, wherein the mandrel layer further comprises a support layer disposed between the substrate and the stop layer.

7. The method of forming trenches according to claim 6, wherein a thickness of the support layer is substantially the same as a thickness of the sacrificial layer plus a thickness of the stop layer.

8. The method of forming trenches according to claim 6, wherein the support layer comprises poly-silicon or amorphous silicon.

9. The method of forming trenches according to claim 1, wherein a thickness of the stop layer is substantially the same as a thickness of the sacrificial layer.

10. The method of forming trenches according to claim 1, wherein the sacrificial layer comprises poly-silicon or amorphous silicon.

11. The method of forming trenches according to claim 1, wherein the first trench has a top width and a bottom width, and the top width is smaller than the bottom width.

12. The method of forming trenches according to claim 1, wherein the first trench has a top width and a bottom width, and the top width is equal to the bottom width.

13. The method of forming trenches according to claim 1, wherein the spacer has an etching selectivity with respect to the material layer and the stop layer.

14. The method of forming trenches according to claim 1, wherein the spacer comprises $SiO_2$, SiN, HTO or HCD-SiN.

15. The method of forming trenches according to claim 1, wherein the material layer comprises $SiO_2$, SiN or organic layer.

16. The method of forming trenches according to claim 1, further comprising:
   forming a mask layer on the substrate, wherein the mandrel layer is disposed on the mask layer; and
   after forming the first trench, patterning the mask layer to form a patterned mask layer having at least one second trench corresponding to the first trench.

17. The method of forming trenches according to claim 16, further comprising:
   after forming the second trench, completely removing the mandrel and the material layer; and
   forming at least one third trench in the substrate by using the patterned mask layer as a mask.

18. The method of forming trenches according to claim 16, wherein the spacer has an etching selectivity with respect to the mask layer.

19. The method of forming trenches according to claim 16, wherein the mask layer comprises SiN, SiON, SiC or APF.

* * * * *